(12) United States Patent
Reynolds et al.

(10) Patent No.: US 10,811,865 B2
(45) Date of Patent: Oct. 20, 2020

(54) DEVICES, SYSTEMS, AND METHODS FOR OBTAINING OPERATIONAL DATA FROM CIRCUIT BREAKERS

(71) Applicant: Eaton Intelligent Power Limited, Dublin (IE)

(72) Inventors: Nicholas David Reynolds, Monroeville, PA (US); Jason Kohei Okerman, Pittsburgh, PA (US); Sandy Omar Jimenez, Monaca, PA (US)

(73) Assignee: Eaton Intelligent Power Limited, Dublin (IE)

( * ) Notice: Subject to any disclaimer, the term of this patent is extended or adjusted under 35 U.S.C. 154(b) by 416 days.

(21) Appl. No.: 15/903,451

(22) Filed: Feb. 23, 2018

(65) Prior Publication Data

US 2019/0267790 A1 Aug. 29, 2019

(51) Int. Cl.
| | | |
|---|---|---|
| *H01H 9/04* | (2006.01) | |
| *H02H 3/04* | (2006.01) | |
| *G01R 31/327* | (2006.01) | |
| *H01H 71/00* | (2006.01) | |
| *H01H 9/54* | (2006.01) | |
| *H02H 3/00* | (2006.01) | |
| *H01H 71/12* | (2006.01) | |

(52) U.S. Cl.
CPC ............. *H02H 3/04* (2013.01); *G01R 31/327* (2013.01); *H01H 9/54* (2013.01); *H01H 71/12* (2013.01); *H01H 2071/006* (2013.01); *H02H 3/00* (2013.01)

(58) Field of Classification Search
USPC ...................................................... 361/42–50
See application file for complete search history.

(56) References Cited

U.S. PATENT DOCUMENTS

| | | | |
|---|---|---|---|
| 5,706,153 A | 1/1998 | Innes et al. | |
| 6,784,770 B2* | 8/2004 | Gimenez | H01H 83/04 335/132 |
| 7,436,641 B2* | 10/2008 | Holley | H01H 9/168 361/64 |
| 7,936,547 B2 | 5/2011 | Dougherty et al. | |
| 8,358,188 B2 | 1/2013 | Bellotto et al. | |
| 2006/0176630 A1* | 8/2006 | Carlino | H02H 1/0061 361/64 |
| 2009/0140871 A1* | 6/2009 | Titus | H02H 3/04 340/638 |
| 2014/0085922 A1 | 3/2014 | Padro | |
| 2016/0139192 A1 | 5/2016 | Okerman et al. | |
| 2017/0184674 A1 | 6/2017 | Okerman | |

* cited by examiner

*Primary Examiner* — Danny Nguyen
(74) *Attorney, Agent, or Firm* — Myers Bigel, P.A.

(57) ABSTRACT

A method for obtaining operational data from a circuit breaker includes: releasably attaching an adapter to a circuit breaker; actuating a test button on the circuit breaker using the adapter; moving a handle of the circuit breaker to an on position; initiating output of a light signal from the circuit breaker that is representative of operational data of the circuit breaker in response to the actuating and moving steps; and receiving the light signal at the adapter.

20 Claims, 18 Drawing Sheets

DEVICES, SYSTEMS, AND METHODS FOR OBTAINING OPERATIONAL DATA FROM CIRCUIT BREAKERS

BACKGROUND

The current process for gathering data from a circuit breaker in the field is to go to a problem site with both a technician and an electrician. The electrician removes the problem breaker which is then sent back to the breaker manufacturer. Upon arrival, the breaker is typically taken apart and the memory is read, and then the unit is scrapped.

SUMMARY

Some embodiments of the invention are directed to a method for obtaining operational data of a circuit breaker. The method includes: releasably attaching an adapter to a circuit breaker; actuating a test button on the circuit breaker using the adapter; moving a handle of the circuit breaker to an on position; initiating output of a light signal from the circuit breaker that is representative of operational data of the circuit breaker in response to the actuating and moving steps; and receiving the light signal at the adapter.

In some embodiments, confirming that the test button was actuated for a predetermined period of time after the moving step, and the initiating output step is further in response to the confirming step.

The adapter may include an actuator including a first portion that is configured to extend from a front surface of the adapter and a second portion that is configured to extend from a rear surface of the adapter. Actuating the test button on the circuit breaker may include engaging the test button with the second portion of the actuator in response to pressing the first portion of the actuator toward the front surface of the adapter.

In some embodiments, actuating the test button on the circuit breaker is in response to the releasably attaching step.

In some embodiments, the method includes powering on the adapter in response to the releasably attaching step. The adapter may include a power button on a rear portion of the adapter. Powering on the adapter in response to the releasably attaching step may include engaging the power button with the circuit breaker.

The circuit breaker may include a light source and the adapter may include a light sensor. The method may include aligning the light source and the light sensor in response to the releasably attaching step.

In some embodiments, the adapter includes at least indicator that is viewable by a user. The method may include determining whether a completion of the light signal was received at the adapter. The method may include, using the at least one indicator, indicating in a first way in response to determining that the completion of the light signal was received at the adapter. The method may include, using the at least one indicator, indicating in a second, different way in response to determining that the completion of the light signal was not received at the adapter.

In some embodiments, the method includes: processing the light signal into data using the adapter; wirelessly transmitting the data from the adapter to an electronic device; and/or displaying the data at the electronic device, wherein the data corresponds to the operational data of the circuit breaker. The method may include wirelessly receiving a data request from the electronic device at the adapter, and the wirelessly transmitting step may be in response to the wirelessly receiving step.

Some other embodiments of the invention are directed to a system for obtaining operational data of a circuit breaker. The system includes a circuit breaker and an adapter. The circuit breaker includes a front face, a test button on the front face, and a handle movable between an on position and an off position. The adapter is configured to be releasably attached to the front face of the circuit breaker in an installed position. In the installed position, the adapter is configured to: actuate the test button; and receive a light signal from the circuit breaker that is representative of operational data of the circuit breaker.

In some embodiments, the adapter is configured to receive the light signal in response to the handle being moved to the on position with the test button being actuated for at least a predetermined period of time.

In some embodiments, the circuit breaker includes a light source on the front face that is configured to output the light signal; the adapter includes a light sensor that is configured to receive the light signal; and/or the light source is aligned with the light sensor with the adapter in the installed position. In some embodiments, the adapter includes an actuator including a first portion that is configured to extend through and away from a front surface of the adapter and a second portion that is configured to extend through and away from a rear surface of the adapter. The second portion of the actuator may actuate the test button in response to pressing the first portion of the actuator toward the front surface of the adapter.

In some embodiments, the adapter actuates the test button in response to the adapter being releasably attached to the front face of the circuit breaker in the installed position.

In some embodiments, the adapter includes a power button on a rear surface of the adapter. The front face of the circuit breaker may engage the power button with the adapter in the installed position to energize the adapter such that the adapter is configured to receive the light signal and process data associated with the light signal.

In some embodiments, the adapter includes at least one indicator that is configured to confirm that a completion of the light signal was received at the adapter.

In some embodiments, the system further includes an electronic device comprising a display. The adapter may be configured to process data associated with the light signal and wirelessly transmit the processed data to the electronic device. The electronic device may be configured to display the processed data on the display, wherein the processed data corresponds to the operational data of the circuit breaker. The electronic device may be configured to send a data request to the adapter. The adapter may be configured to wirelessly transmit the processed data in response to receiving the data request.

In some embodiments, the adapter is held on the circuit breaker with a friction fit in the installed position.

Some embodiments of the invention are directed to a system including a circuit breaker and an adapter. The circuit breaker includes a front face with a light source on the front face. The adapter is configured to be releasably held on the front face in an installed position. The adapter includes a light sensor. The light source and the light sensor are configured to communicate such that the adapter receives operational data from the circuit breaker in the installed position.

In some embodiments, the adapter includes a housing having a front portion and a rear portion. The rear portion may include first and second spaced apart side rails that are configured to engage first and second side surfaces of the front face to hold the adapter in the installed position optionally with a friction fit.

The rear portion of the adapter housing may include a lower rail that is configured to engage a lower surface of the front face in the installed position. The first and second side rails and the first and second side surfaces may cooperate to align the adapter and the front face in a first direction. The lower rail and the lower surface may cooperate to align the adapter and the front face in a second direction that is orthogonal to the first direction.

In some embodiments, the light sensor is aligned with the light source in the installed position. The first and second side rails and the first and second side surfaces may cooperate to align the light sensor and the light source in a first direction. The lower rail and the lower surface may cooperate to align the light sensor and the light source in a second direction that is orthogonal to the first direction.

In some embodiments, the rear portion of the adapter housing includes an upper rail that is configured to engage the front face in the installed position. The first and second side rails, the lower rail, and/or the upper rail may be configured to block ambient light with the adapter in the installed position.

In some embodiments, the circuit breaker includes a test button that protrudes from or is substantially flush with the front face. The adapter may be configured to actuate the test button when the adapter is in the installed position. The adapter may include an actuator including a first actuator portion that is configured to extend through and protrude from the front portion of the adapter housing and a second actuator portion that is configured to extend through and protrude from the rear portion of the adapter housing. The second actuator portion may be configured to actuate the test button in response to a user actuating the first actuator portion. The first actuator portion may be on a first side of a printed circuit board and the second actuator portion may be on a second, opposite side of the printed circuit board. The printed circuit board may be optionally movably disposed in an interior cavity defined by the adapter housing.

In some embodiments, the circuit breaker is one of a plurality of circuit breakers held in an enclosure. When the adapter is in the installed position on the circuit breaker, the adapter may be sized to not interfere with the functionality of any other one of the plurality circuit breakers.

In some embodiments, the system includes an electronic device in communication with the adapter and configured to receive the operational data from the adapter. The electronic device may be configured to wirelessly receive the operational data from the adapter. The electronic device may include a display device configured to display the operational data.

Further features, advantages and details of the present invention will be appreciated by those of ordinary skill in the art from a reading of the figures and the detailed description of the preferred embodiments that follow, such description being merely illustrative of the present invention.

DETAILED DESCRIPTION

Figure 1:
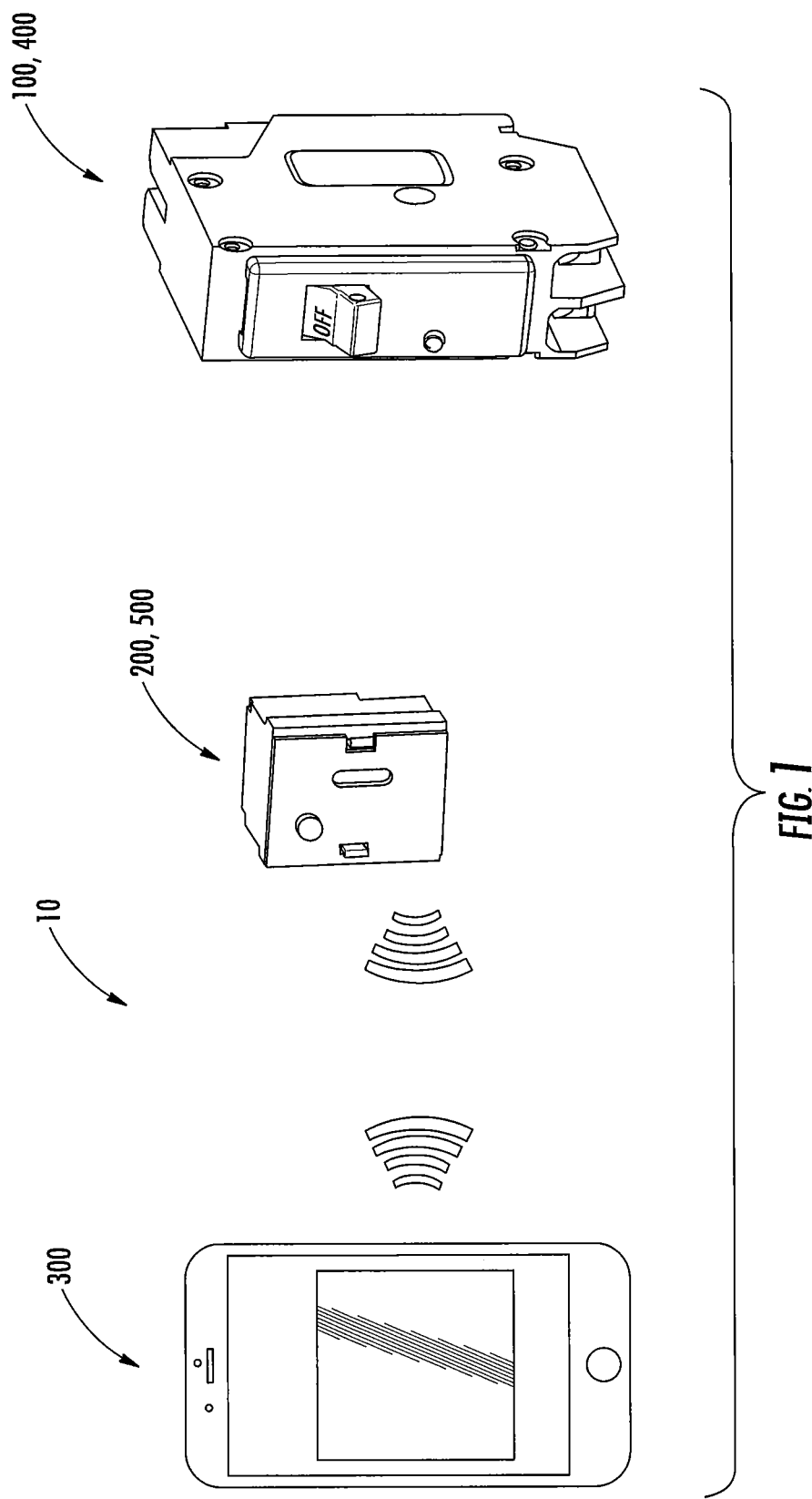
FIG. 1 illustrates a system for obtaining operational data from a circuit breaker according to some embodiments.

The present invention now will be described more fully hereinafter with reference to the accompanying drawings, in which illustrative embodiments of the invention are shown. In the drawings, the relative sizes of regions or features may be exaggerated for clarity. This invention may, however, be embodied in many different forms and should not be construed as limited to the embodiments set forth herein; rather, these embodiments are provided so that this disclosure will be thorough and complete, and will fully convey the scope of the invention to those skilled in the art.

It will be understood that when an element is referred to as being "coupled" or "connected" to another element, it can be directly coupled or connected to the other element or intervening elements may also be present. In contrast, when an element is referred to as being "directly coupled" or "directly connected" to another element, there are no intervening elements present. Like numbers refer to like elements throughout. As used herein the term "and/or" includes any and all combinations of one or more of the associated listed items.

In addition, spatially relative terms, such as "under," "below," "lower," "over," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is inverted, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly.

Well-known functions or constructions may not be described in detail for brevity and/or clarity.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

It is noted that any one or more aspects or features described with respect to one embodiment may be incorporated in a different embodiment although not specifically described relative thereto. That is, all embodiments and/or features of any embodiment can be combined in any way and/or combination. Applicant reserves the right to change any originally filed claim or file any new claim accordingly, including the right to be able to amend any originally filed claim to depend from and/or incorporate any feature of any other claim although not originally claimed in that manner. These and other objects and/or aspects of the present invention are explained in detail in the specification set forth below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

A system 10 for obtaining operational data from a circuit breaker is shown in FIG. 1. The system 10 includes a circuit breaker 100 and an adapter 200. The system 10 may further include an electronic device 300 that communicates with the adapter 200.

Figure 10:
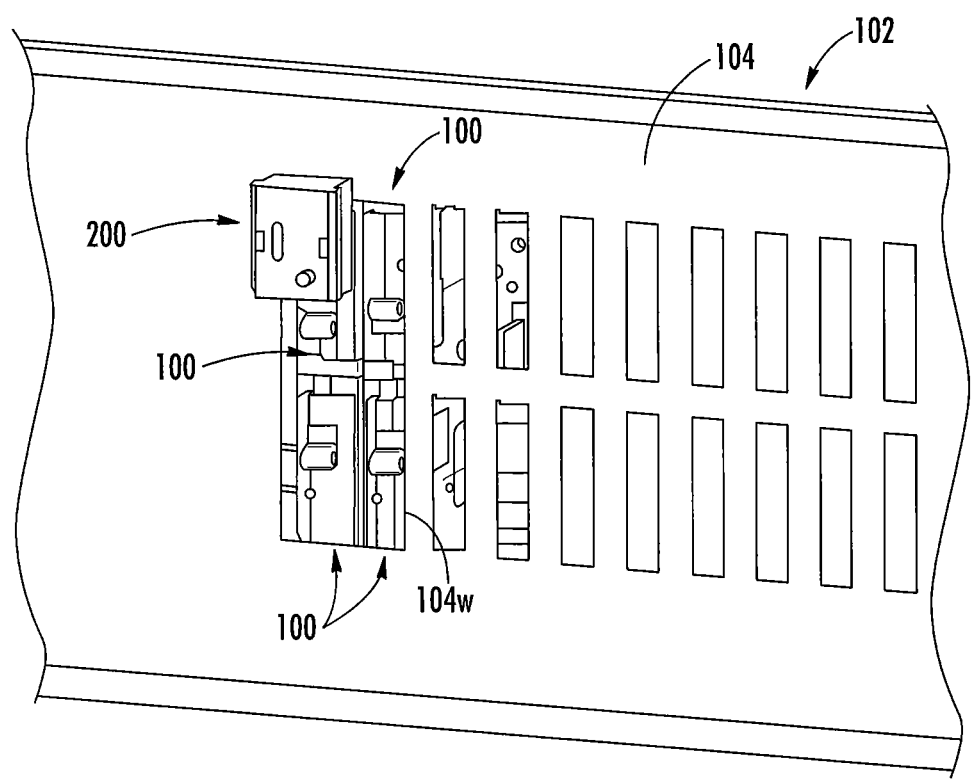
FIG. 10 is a fragmentary perspective view of an enclosure holding a plurality of circuit breakers and the adapter of FIG. 3 installed on only one of the circuit breakers in an installed position.

The circuit breaker 100 may be a residential miniature circuit breaker. Referring to FIG. 10, a plurality of the circuit breakers 100 may be held in an enclosure 102. The enclosure 102 may include a front panel or dead front 104. The front panel or dead front 104 may include access windows 104w. The system 10 (FIG. 1) may include the plurality of circuit breakers 100 and/or the enclosure 102 in some embodiments.

Figure 2:
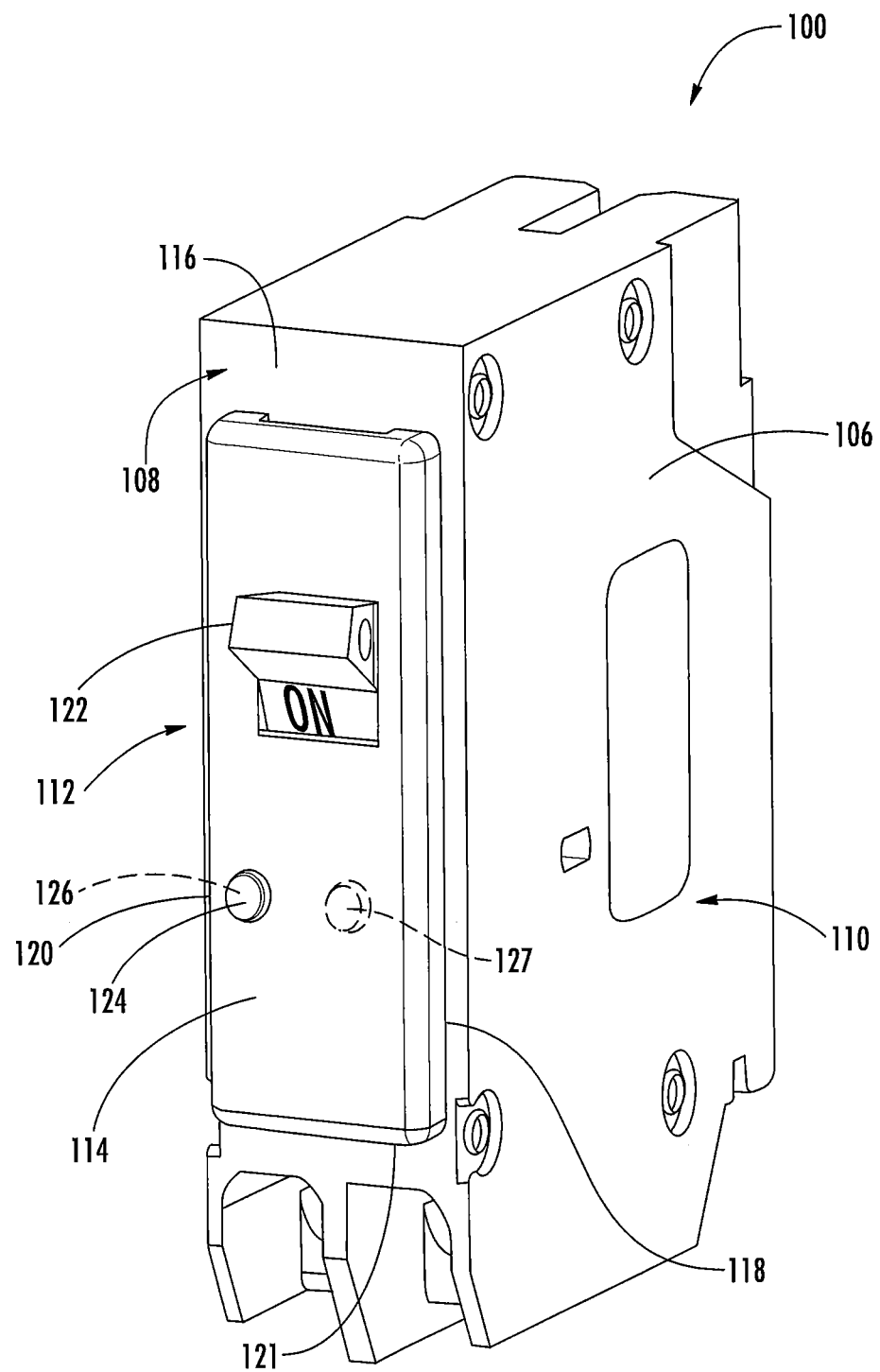
FIG. 2 is a front perspective view of a circuit breaker of the system of FIG. 1 according to some embodiments.

Referring to FIG. 2, the circuit breaker 100 includes an enclosure or housing 106. The housing 106 includes a front or front portion 108 and first and second laterally spaced apart opposite sides or side portions 110, 112. A front or exposed face 114 may be on the front portion 108. The front face 114 may be raised relative to a flat surface 116 of the front portion 108. The raised front face 114 may include a perimeter with first and second laterally spaced apart opposite side surfaces or walls 118, 120. The raised front face 114 may also include a lower or bottom surface or wall 121.

The circuit breaker 100 includes a handle or switch 122 at the front portion 108 of the housing 106. The handle 122 may extend through the front face 114. The handle 122 is movable (e.g., pivotable) between an on position (FIG. 2) and an off position (FIG. 1). As is understood by those skilled in the art, under normal operation, the circuit breaker 100 may electrically connect a power source and a load when the handle 122 is in the on position and may electrically disconnect the power source and the load when the handle is in the off position.

The circuit breaker 100 may include a user interface input such as a test button 124 at the front portion 108 of the housing 106. The button 124 may extend through or be flush with the front face 114 (e.g., when not depressed). The circuit breaker 100 may include a light source 126 such as an LED. The test button 124 may be translucent or transparent such that the light source 126 is configured to illuminate the button 124. The light source 126 may be integrated with the button 124, may be positioned in the button 124, or may otherwise be positioned so as to illuminate the button 124.

Alternatively, there may be a light source 127 such as an LED on the front face 114 or elsewhere on the circuit breaker 100. For example, the light source 127 may be adjacent the button 124 as shown in FIG. 2.

Figure 3:
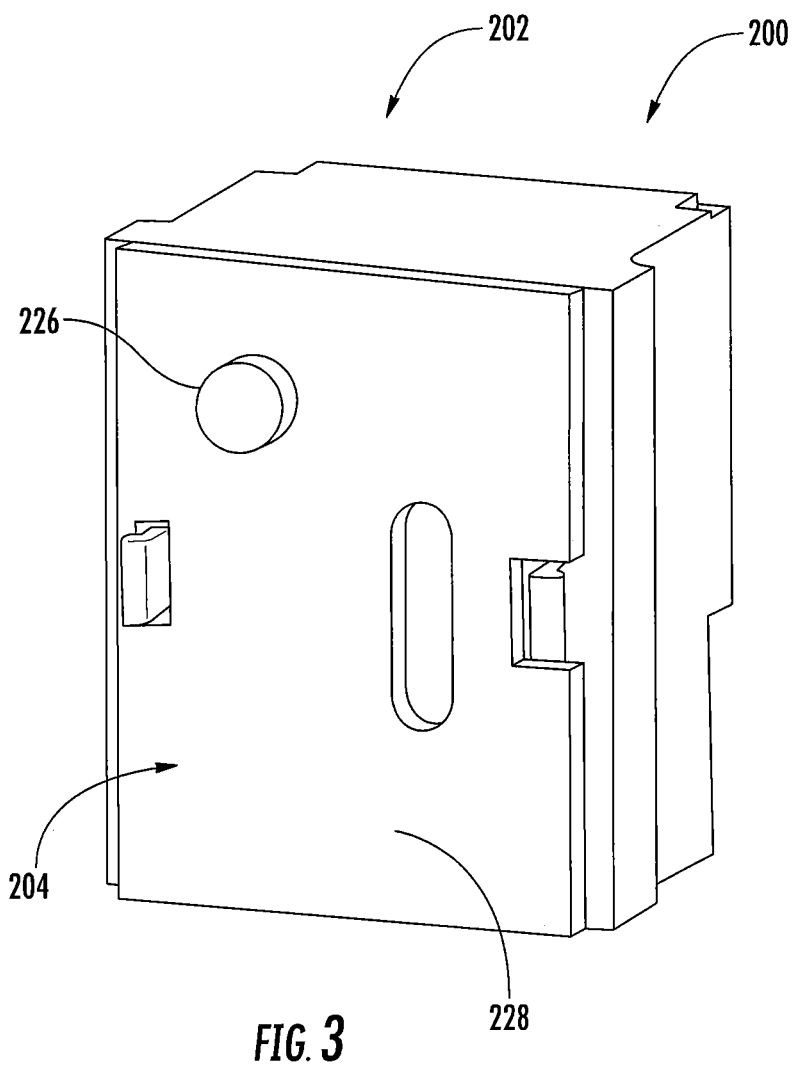
FIG. 3 is a front perspective view of an adapter of the system of FIG. 1 according to some embodiments.
Figure 4A:
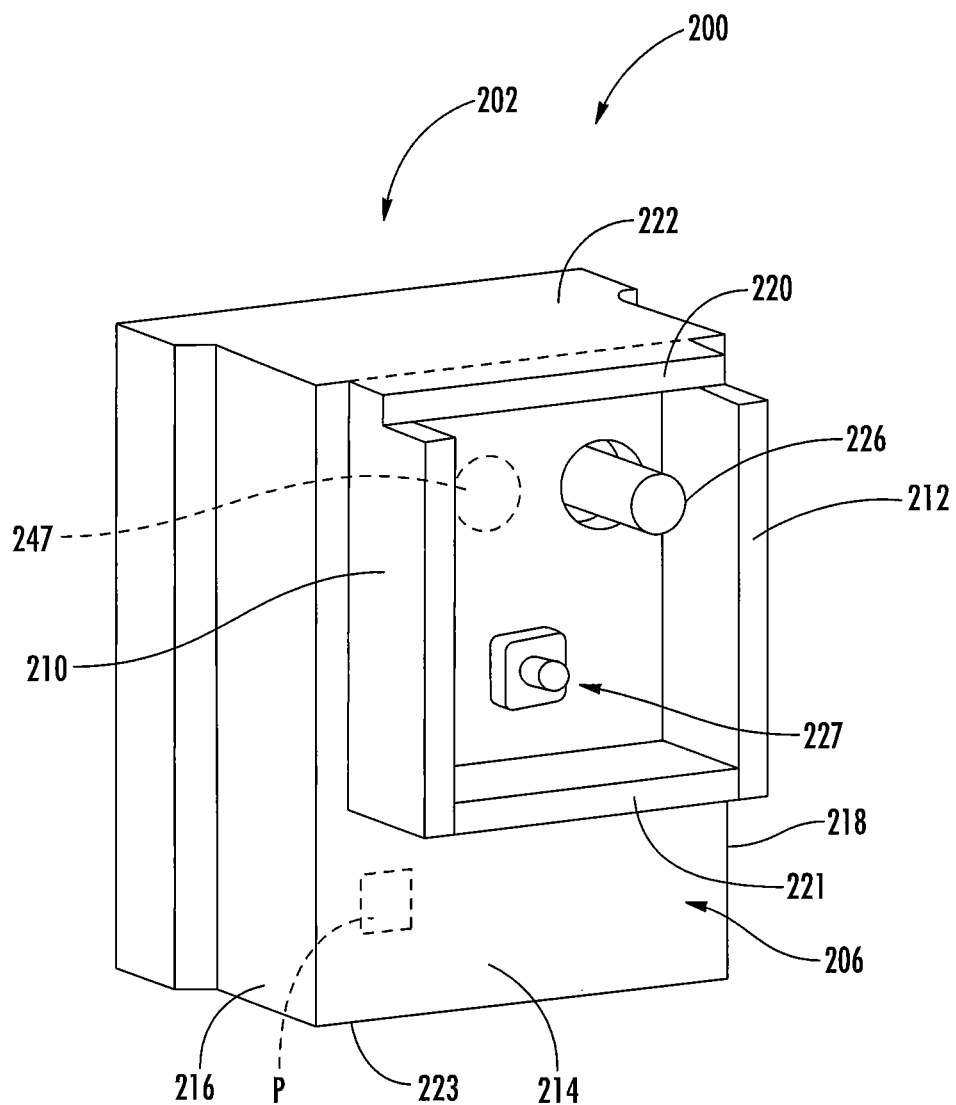
FIG. 4A is a rear perspective view of the adapter of FIG. 3.

Referring to FIGS. 3 and 4A, the adapter 200 includes an enclosure or housing 202. The housing 202 includes a front portion 204 and a rear portion 206. The adapter 200 includes first and second spaced apart side rails 210, 212 at the rear portion 206. The rails 210, 212 may extend vertically and project outwardly from a rear face or surface 214 of the adapter housing 202. Alternatively, the rails may extend from first and second side faces or surfaces 216, 218 of the adapter housing 202, respectively.

The adapter 200 may include an upper rail 220. The upper rail 220 may be perpendicular to the first and second side rails 210, 212. The upper rail 220 may be a continuation of and/or may be flush with an upper face or surface 222 of the adapter housing 202.

The adapter may include a lower rail 221. The lower rail 221 may be perpendicular to the first and second side rails 210, 212. The lower rail 221 may extend outwardly from the rear surface 214 a greater amount or distance than the upper rail 220. The lower rail 221 may extend outwardly from the rear surface 214 the same or about the same amount or distance as the first and second side rails 210, 212.

The adapter 200 may include an actuator 226. The actuator 226 may be configured to protrude from a front face or surface 228 of the adapter housing 202. The actuator 226 may also be configured to protrude from the rear face 214 of the adapter housing 202 between the first and second side rails 210, 212. The actuator 226 may be closer to one of the side rails 210, 212 than the other of the side rails 210, 212 (e.g., the actuator 226 may be closer to the side rail 212 than the side rail 210). The actuator 226 may be closer to the upper surface 222 than a lower surface 223 of the adapter housing 202.

The adapter 200 may include a power or wake up button 227 that protrudes from the rear surface 214 of the adapter 200.

Figure 5A:
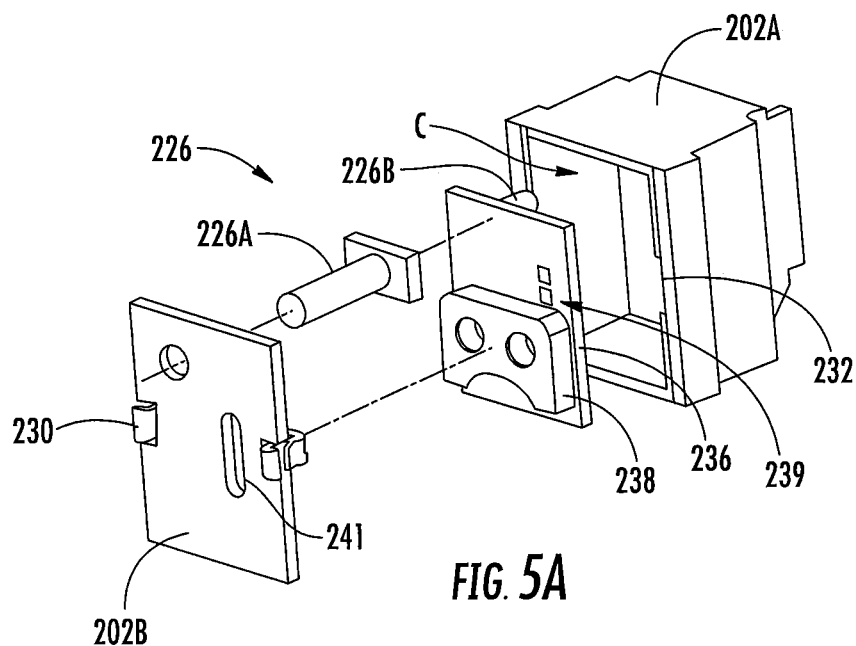
FIG. 5A is an exploded view of the adapter of FIG. 3.
Figure 5B:
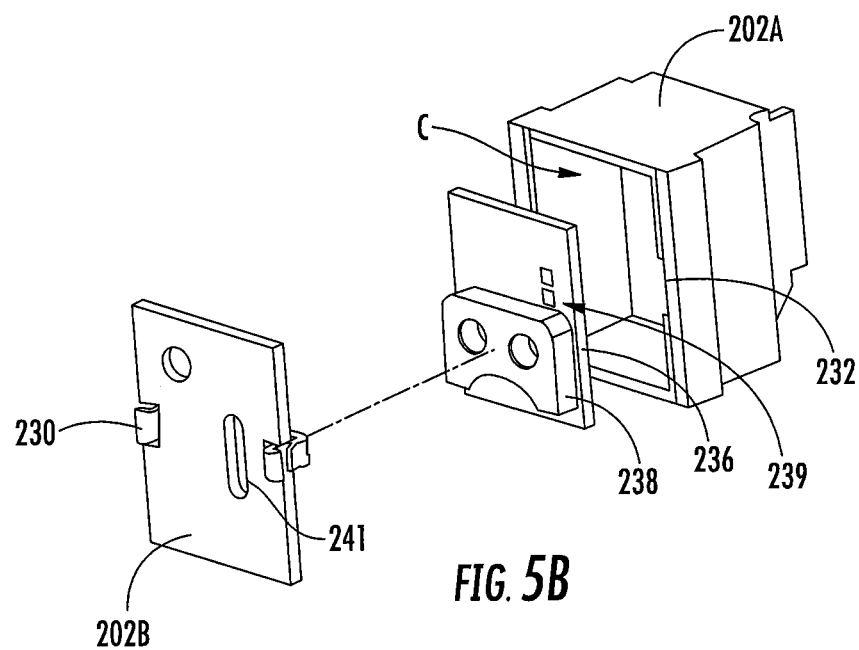
FIG. 5B is an exploded view of the adapter of FIG. 4B.

FIG. 5A is an exploded view of the adapter 200 according to some embodiments. The adapter housing 202 may include a first housing portion or base 202A and a second housing portion or cover 202B. The cover 202B may include tabs 230 on opposite sides thereof. The tabs 230 may be configured to be received in grooves 232 in the base 202A to couple the cover 202B to the base 202A. Other attachment features may be used.

The base 202A may define an interior cavity C. The cavity C may be configured to be enclosed or substantially enclosed when the cover 202B is coupled to the base 202A.

A substrate or printed circuit board (PCB) 236 may be disposed in the cavity C. An electronic component housing 238 may be on and/or electrically coupled to the PCB 236.

As described in more detail below, the electronic component housing 238 may hold, for example, a controller and a wireless communication unit with a transceiver or other wireless module.

One or more indicators 239 such as LEDs may be on the PCB 236. A slot or window 241 may be defined in the cover 202B to allow a user to view (visually access) the LED(s) 239.

Figure 6A:
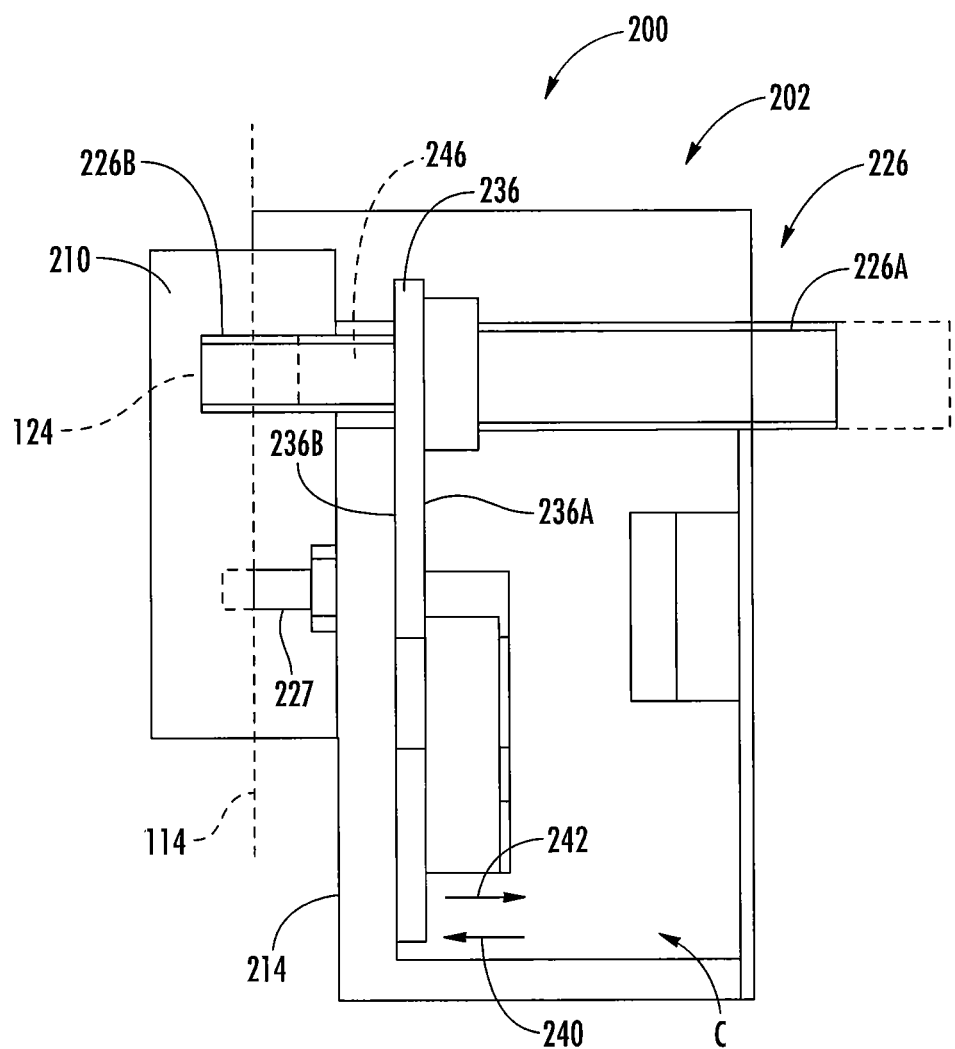
FIG. 6A is a sectional view of the adapter of FIG. 3.

Referring to FIGS. 5A and 6A, the actuator 226 may include a first actuator portion 226A and a second actuator portion 226B. The first actuator portion 226A is on a first side 236A of the PCB 236 and the second actuator portion 226B is on an opposite second side 236B of the PCB 236.

The PCB 236 may be movable or slidable within the cavity C of the adapter housing 202. The PCB 236 may move or slide in the direction 240 in response to a user actuating or depressing the actuator 226 (e.g., the first actuator portion 226A). The PCB 236 may move or slide in the direction 242 in response to the user releasing the actuator 226 (e.g., the first actuator portion 226A).

The actuator 226 (e.g., the second actuator portion 226B) may further protrude from the rear surface 214 of the adapter housing in response to the user actuating or depressing the actuator 226 (e.g., the first actuator portion 226A). For example, referring to FIG. 6A, the first and second actuator portions 226A, 226B may be in the position shown in dashed lines in a rest state. The first and second actuator portions 226A, 226B may be in the position shown in solid lines in an actuated state after the user actuates the first actuator portion 226A.

The adapter 200 may include a light sensor 246. The light sensor 246 may be integrated with or held in the actuator 226 (e.g., the second actuator portion 226B) or otherwise coupled to the actuator 226. The light sensor 246 may be on and/or electrically coupled to the PCB 236. Alternatively, referring to FIGS. 2 and 4B, where the LED 127 is used, the adapter 200 may include a light sensor 247 that may be on and/or electrically coupled to the PCB 236.

Figure 4B:
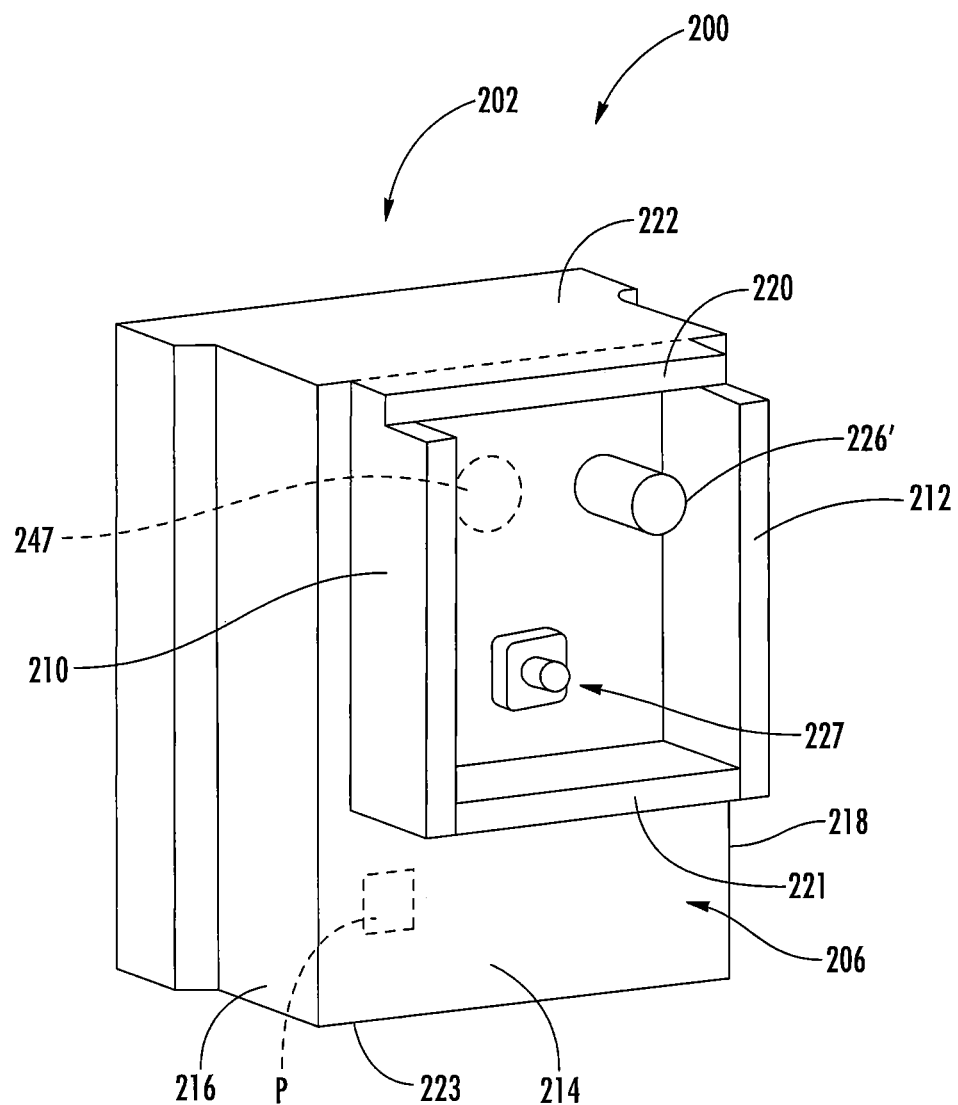
FIG. 4B is a rear perspective view of an adapter of the system of FIG. 1 according to some other embodiments.
Figure 7:
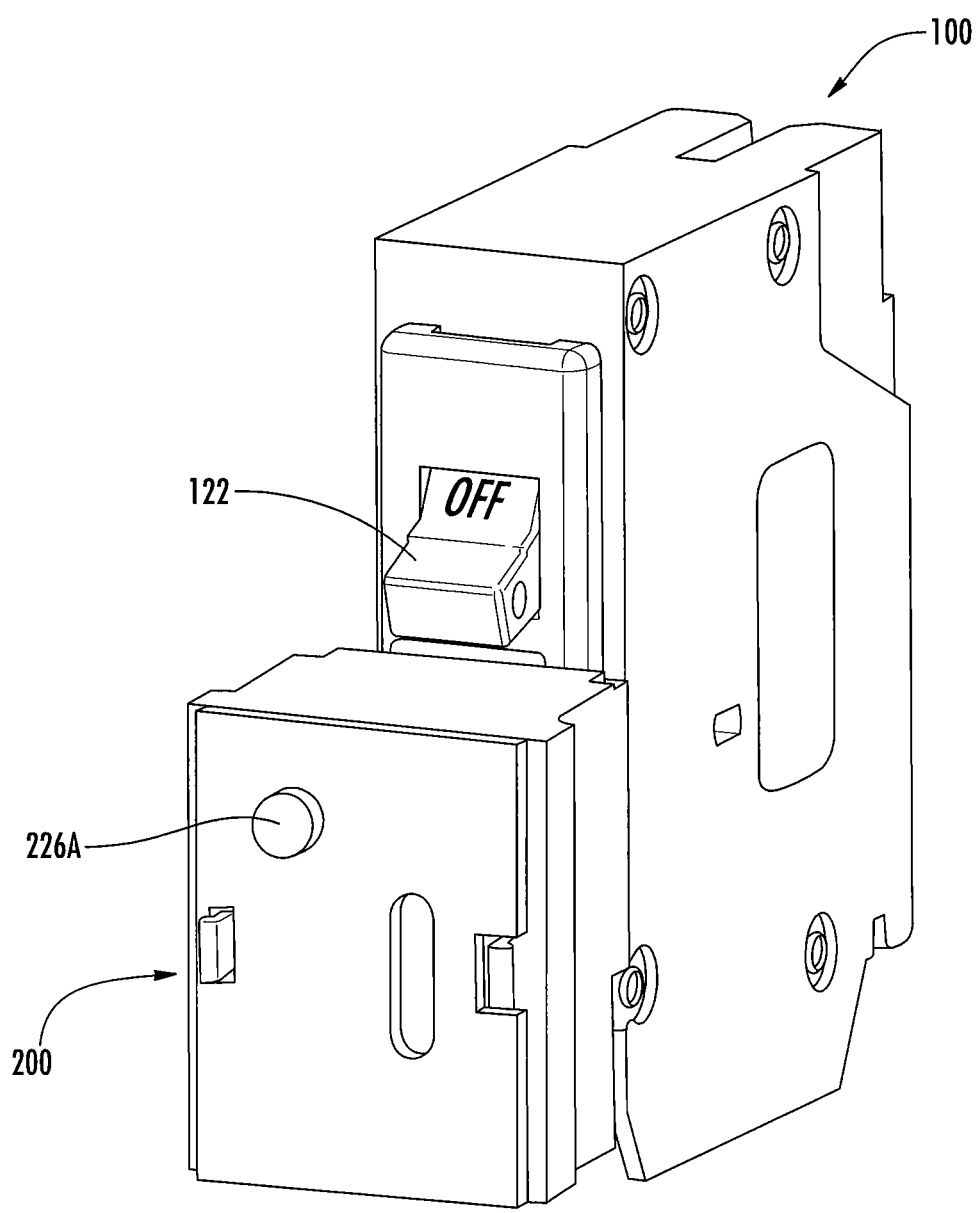
FIG. 7 is a perspective view of the adapter of FIG. 3 installed on the circuit breaker of FIG. 2 in an installed position.

In use, a user installs the adapter 200 on the circuit breaker 100 in the installed position as shown in FIG. 7. With reference to FIGS. 2, 4A, and 4B, the first and second rails 210, 212 may engage the first and second side surfaces 118, 120, respectively, of the circuit breaker front face 114. The first and second rails 210, 212 may be spaced apart the same distance or a lesser distance than the first and second side surfaces 118, 120 so that the adapter 200 is held on the circuit breaker 100 with a friction or interference fit in the installed position.

Alternatively, the first and second rails 210, 212 may engage the first and second sides 110, 112 of the circuit breaker 100 and the adapter 200 may be held on the circuit breaker 100 with a friction or interference fit. Other releasably attachable configurations may be used.

The first and second rails 210, 212 may help align the adapter 200 in a first direction (e.g., horizontally). The lower rail 221 may help align the adapter 200 in a second direction that is perpendicular to the first direction (e.g., vertically). In the installed position, the lower rail 221 may engage the lower surface 121 of the circuit breaker front face 114. The cooperation of the lower rail 221 and the lower surface 121 of the circuit breaker front face 114 may contribute to the friction fit with the adapter 200 in the installed position.

In the installed position, the second actuator portion 226B of the adapter 200 (FIG. 6A) may be aligned with the test button 124 of the circuit breaker 100 (FIG. 2). In this regard, the light sensor 246 of the adapter 200 (FIG. 6A) may be aligned with the light source 126 of the circuit breaker (FIG. 2). Alternatively, in the installed position, the light sensor 246 of the adapter 200 (FIG. 4A) may be aligned with the light source 127 of the circuit breaker (FIG. 2).

Figure 8:
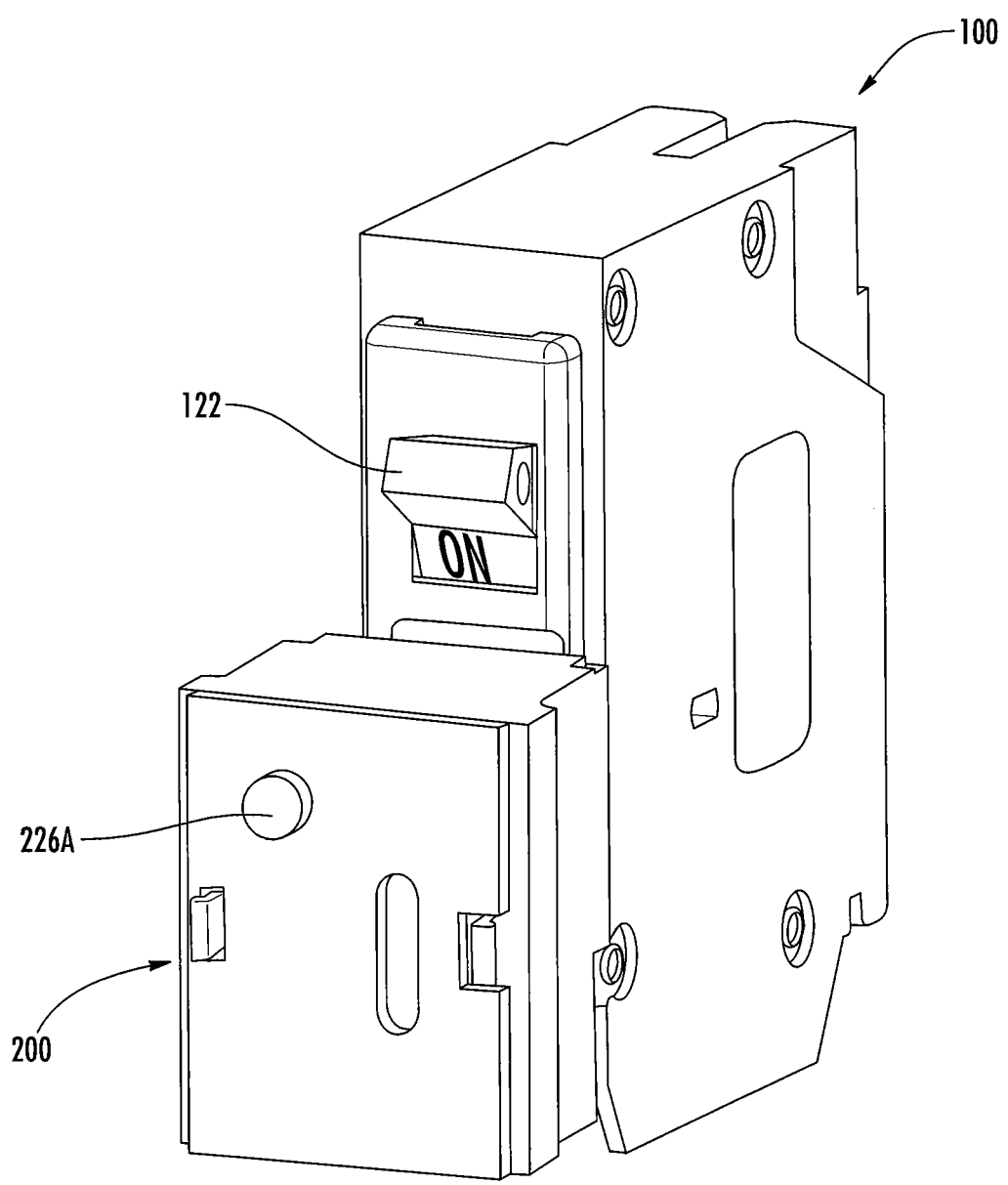
FIG. 8 is another perspective view of the adapter of FIG. 3 installed on the circuit breaker of FIG. 2 in the installed position.

The adapter 200 may receive and collect operational data of the circuit breaker 100 with the adapter 200 in the installed position. For example, the user may actuate or depress the first actuator portion 226A such that the second actuator portion 226B moves to the position shown in solid lines in FIG. 6A. The second actuator portion 226B may then actuate or depress the test button 124 of the circuit breaker 100 (FIG. 2). The user may then move the handle 122 of the circuit breaker 100 to the on position as shown in FIG. 8. After a predetermined amount of time of actuating or depressing the first actuator portion 226A, the user may release the first actuator portion 226A. In some embodiments, the predetermined amount of time is between one and ten seconds, such as two seconds. This may trigger the circuit breaker 100 to pulse the light source 126 or 127 (FIG. 2), with the light pulses representative of operational data of the circuit breaker 100. The light pulses may be detected by the light sensor 246 or 247 of the adapter 200 (FIGS. 4A and 6A). The data may be processed and/or transmitted, e.g., wirelessly, to the electronic device 100 (FIG. 1).

The operational data of the circuit breaker 100 may include trip history, fault conditions, load characteristics, and/or measurements taken by the circuit breaker. The operational data may include or identify a cause of a trip of the circuit breaker 100. However, the operational data may also include other information other than the cause of a trip including, but not limited to, information related to the cause of the trip that may be beneficial in diagnosing the circuit breaker 100 or any circuits associated therewith. The operational data may include, for example and without limitation, a voltage level, a current level, or a peak level prior to a trip, a number of lifetime trips, and high frequency characteristics. The operational data may also include, for example and without limitation, a logged history of each fault instance and root cause of trip, other various information prior to a trip, a time duration between a fault event and a trip command, or other information not directly related to the most recent fault. Example fault conditions include, but are not limited to, an over current, a short circuit, a ground fault, or an arc fault.

It is contemplated that, instead of the moving actuator 226 as described above, the adapter 200 may include a fixed protrusion such as a pin or post that engages the test button 124 of the circuit breaker 100 when the adapter 200 is in the installed position. For example, referring to FIGS. 4B and 6B, the adapter 200 may include a protrusion 226' such as a pin or post that protrudes from or extends away from the rear surface 214 of the adapter 200. The protrusion 226' may be positioned and configured to engage the test button 124 of the circuit breaker when the adapter 200 is in the installed position. The light sensor 246 may be integrated with or held in the protrusion 226' or otherwise coupled to the protrusion 226'. The PCB 236 may be fixed in the cavity C of the adapter housing 202 rather than being movable or slidable therein.

Figure 6B:
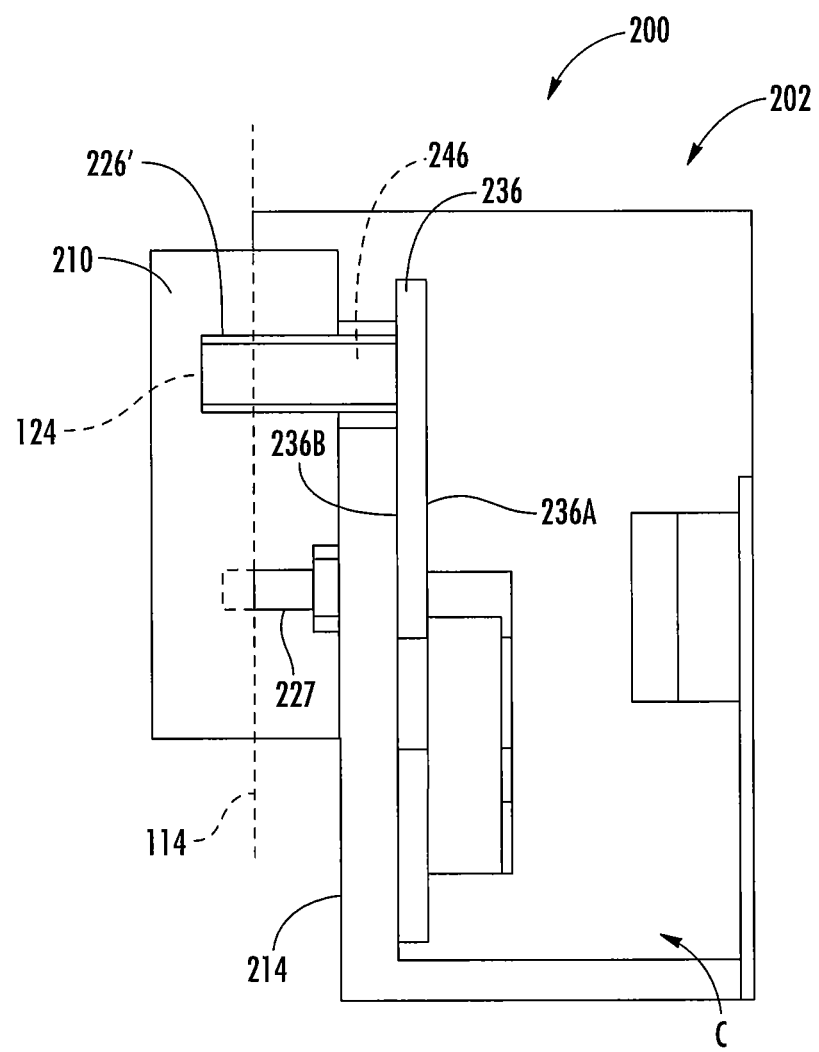
FIG. 6B is a sectional view of the adapter of FIG. 4B.

In such an embodiment, the user may install the adapter 200 in the installed position on the circuit breaker 100; as a result, the protrusion 226' actuates the test button 124 of the circuit breaker 100 (FIG. 2). The user may then move the handle 122 of the circuit breaker 100 to the on position. After a predetermined amount of time after moving the handle 122 to the on position, the circuit breaker 100 may pulse the light source 126 or 127 (FIG. 2), with the light pulses representative of operational data of the circuit breaker 100. The light pulses may be detected by the light sensor 246 or 247 of the adapter 200 (FIGS. 4B and 6B). The data may be processed and/or transmitted, e.g., wirelessly, to the electronic device 100 (FIG. 1).

It is also contemplated that some other portion of the adapter 200 may actuate or engage the test button 124 of the circuit breaker 100 when the adapter 200 is in the installed position. For example, the rear surface 214 of the adapter 200 may actuate or engage the test button 124 of the circuit breaker 100 when the adapter 200 is in the installed position.

Referring to FIGS. 2, 4A, 4B, 6A, and 6B, when the user releasably attaches the adapter 200 on the circuit breaker 100 in the installed position, the circuit breaker front face 114 may engage the on button 227 on the adapter rear surface 214. This may place the adapter 200 in standby mode such that the adapter 200 is ready to receive data from the circuit breaker 100. For example, the on button 227 may operate a circuit associated with an internal power source P of the adapter 200 (e.g., a battery).

Figure 9:
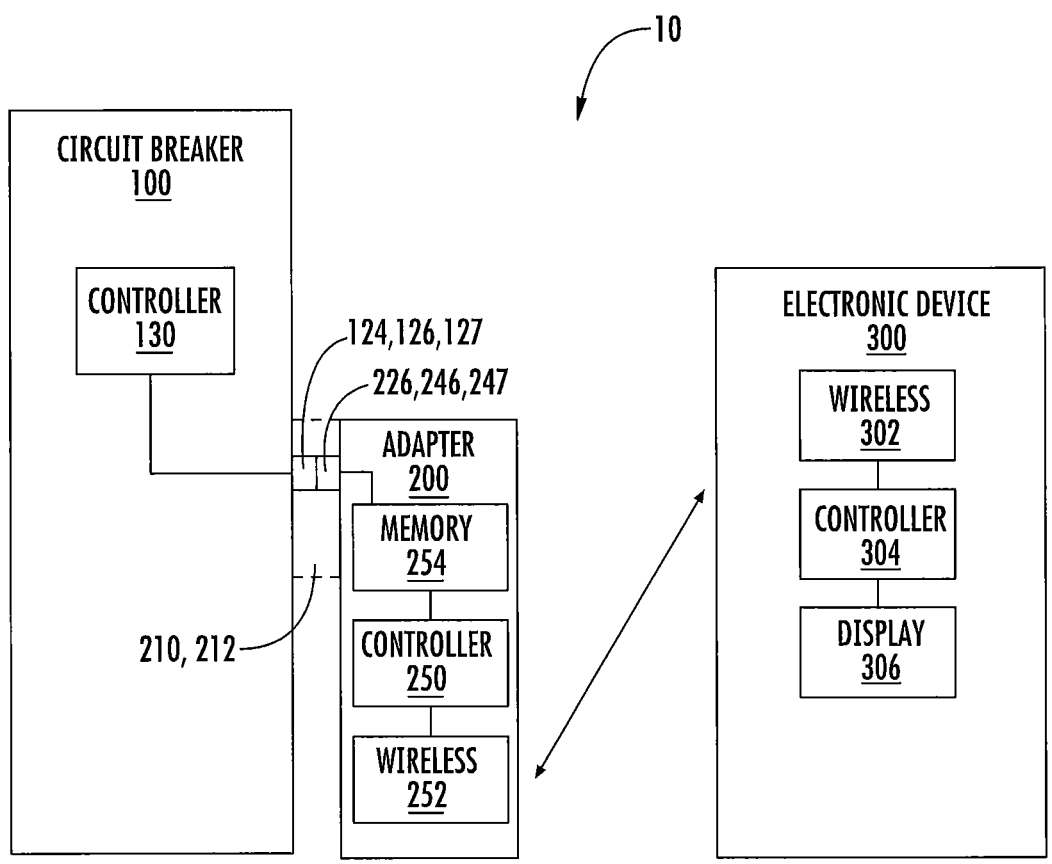
FIG. 9 is a schematic diagram of the system of FIG. 1.

The system 10 is further illustrated schematically in FIG. 9. In response to the user action, a controller or processor 130 of the circuit breaker 100 may encode the operational data into light pulses and direct the light source 126 or 127 to output the light pulses. The light sensor 246 or 247 of the adapter 200 communicates with (and may be aligned with) the light source 126 or 127 of the circuit breaker 100. The light sensor 246 or 247 may sense the light pulses. The light pulses may be converted to digital data and sent to a controller or processor 250 of the adapter 200. The controller 250 may decode the data into digital bits using, e.g., an asynchronous method of measuring the width of the light pulses. The adapter 200 may include a wireless communication module or unit 252 including a transmitter or transceiver to transmit the data to the electronic device 300 (e.g., via Bluetooth, Wifi, etc.). The electronic device 300 may include a wireless communication module or unit 302 including a receiver or transceiver to receive the data. The electronic device 300 may include a controller or processor 304 that is configured to direct a display device 306 to display the data thereon.

The electronic device 300 may be any suitable electronic device. For example, the electronic device 300 may be portable electronic device such as a smartphone or a tablet computer.

FIGS. 14-18 are flowcharts illustrating example operations of the system 10 in greater detail. As described above, a user may releasably attach the adapter 200 on the breaker 100 that has been turned off. The user may then hold down the actuator 226 and turn the handle 122 of the circuit breaker 100 to the on position, thereby energizing the breaker. The user may then wait a predetermined amount of time (e.g., two seconds) and then release the actuator 226 to initiate the data transfer from the circuit breaker 100 to the adapter 200. After the data transfer is complete, the user can then wirelessly connect to the electronic device 300 (for example, a Bluetooth low energy enabled device) to retrieve the data.

Figure 14:
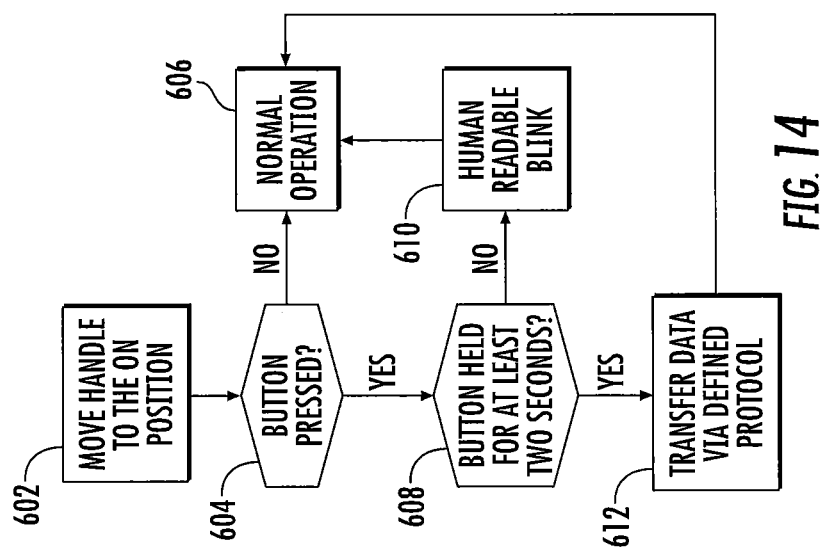

FIG. 14 illustrates example operations from the perspective of the circuit breaker 100. The handle 122 is moved to the on position (Block 602). If it is determined the test button 124 is not pressed (Decision 604), the circuit breaker 100 resumes normal operation (Block 606). The process continues if it is determined the test button 124 is pressed (Decision 604). If the test button 124 is not held for a predetermined amount of time (Decision 608), the circuit breaker 100 and/or the adapter may provide a human readable (or visible) blink (Block 610). For example, the light source 126 or 127 of the circuit breaker 100 may blink to indicate to the user that the process should be restarted. Additionally or alternatively, the LED(s) 239 of the adapter 200 may blink to indicate to the user that the process should be restarted. If the test button 124 is held for a predetermined amount of time (Decision 608), the circuit breaker 100 transfers the data via a defined protocol (Block 612). The defined protocol may include a light data signal including light pulses. These operations may be carried out using the controller 130 of the circuit breaker 100 (FIG. 9).

Figure 15:
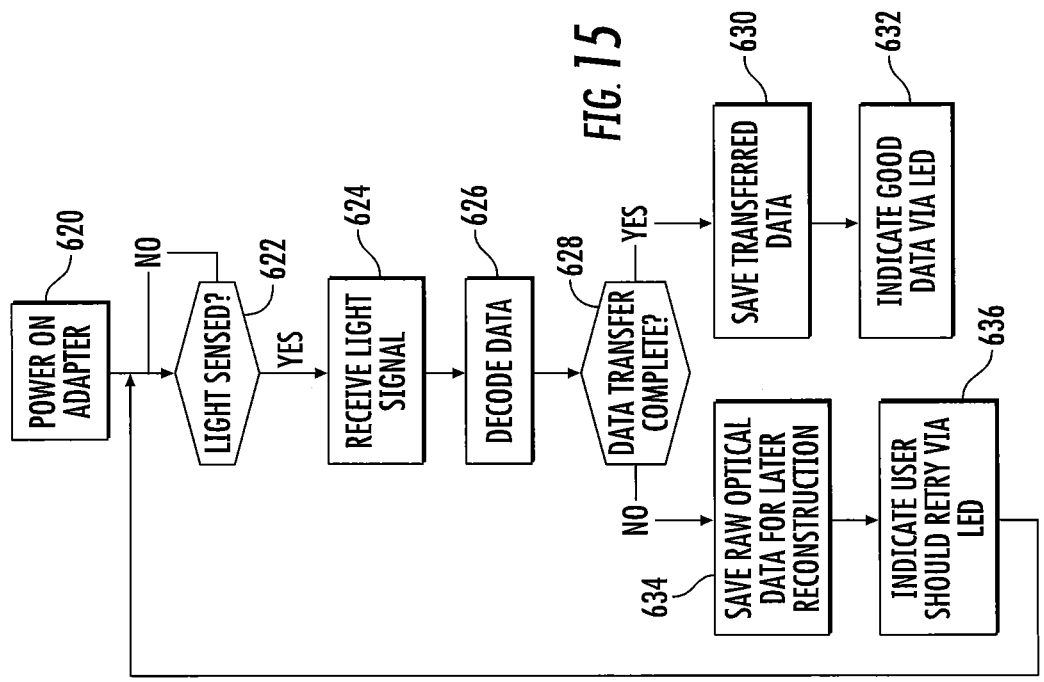
FIGS. 14-18 are flowcharts illustrating operations according to some embodiments.

FIG. 15 illustrates example operations from the perspective of the adapter 200. The adapter may be powered on (Block 620). For example, the front face 114 of the circuit breaker 100 may engage the power button 227A of the adapter 200 when the latter is in the installed position. If light is sensed by the adapter light sensor 246 or 247 (Decision 622), the adapter 200 receives the light signal from the circuit breaker 100 (Block 624). The adapter 200 may decode data associated with the light signal (Block 626). For example, the adapter 200 may decode the data into digital bits using an asynchronous method of measuring the width of the light pulses. The adapter may determine whether the data transfer is complete (Decision 628). If the data transfer is complete, the adapter 200 may save the transferred data in memory (Block 630). The adapter may also indicate to a user that the data transfer is complete (Block 632). For example, the LED(s) 239 of the adapter may blink in a particular way and/or may illuminate with a certain color (e.g., green). If it is determined that the data transfer was not completed, the adapter 200 may save raw optical data in memory for later reconstruction (Block 634). The adapter may also indicate to a user that the data transfer was not completed (Block 634). For example, the LED(s) 239 of the adapter may blink in a particular way and/or may illuminate with a certain color (e.g., red). These operations may be carried out using the controller 250 and/or memory 254 of the adapter 200 (FIG. 9).

As described above, if it is determined that the data transfer is complete, the adapter 200 may save the transferred data in memory (Block 630). For example, the data may be transferred to a Bluetooth low energy module (which may be included in the wireless module 252, FIG. 9), where the data is stored and is ready to be queried by an electronic device that wirelessly connects to it.

Figure 16:
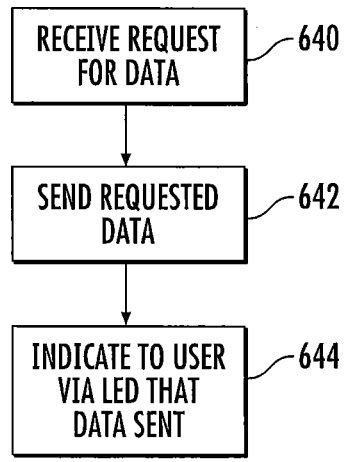

FIG. 16 illustrates example further operations from the perspective of the adapter 200. A request for data may be received from an electronic device (Block 640). In response, the adapter 200 may send the data to the electronic device (Block 642). The adapter may indicate to a user that the data has been successfully sent (Block 644). For example, the LED(s) 239 of the adapter may blink in a particular way and/or may illuminate with a certain color (e.g., green). These operations may be carried out using the controller 250 and/or the wireless module 252 of the adapter 200 (FIG. 9).

Figure 17:
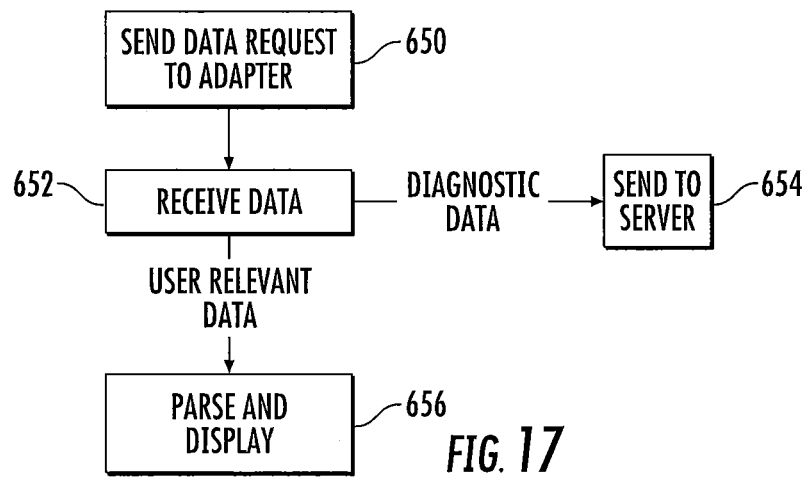

FIG. 17 illustrates example operations from the perspective of the electronic device 300. The electronic device 300 may send a data request to the adapter 200 (Block 650). The electronic device 300 may then receive the data from the adapter 200 (Block 652). In some embodiments, diagnostic data may be sent to a server (Block 654). The electronic device 300 may parse the data and display the data (e.g., the operational data of the circuit breaker) (Block 656). These operations may be carried out using the wireless module 302, the controller 304, and/or the display 306 of the electronic device 300 (FIG. 9).

It is noted that operational data from multiple circuit breakers may be serially obtained and stored in the memory 254 on the adapter 200 (FIG. 9). The data for the multiple circuit breakers may then be transmitted to the electronic device 300.

Figure 18:
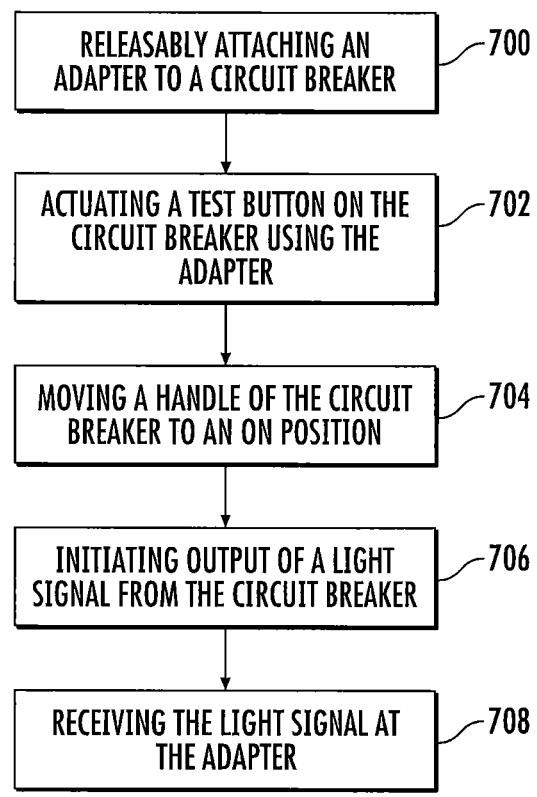

FIG. 18 illustrates example operations that may be carried out using the system 10. The adapter 200 may be releasably attached to the circuit breaker 100 (Block 700). For example, as described herein, the front face 114 of the circuit breaker 100 may be received between the first and second side rails 210, 212 such that the first side rail 210 engages a first side surface 118 of the front face 114 and the second side rail 212 engages a second side surface 120 of the front face 114 (see, e.g., FIGS. 2 and 4A). Further, the lower rail 221 of the adapter 200 may engage the lower surface 121 of the front face 114 and/or the upper rail 220 of the adapter may engage the front face 114 of the circuit breaker 100 (see, e.g., FIGS. 2 and 4A). The adapter 200 may be releasably attached to the circuit breaker 100 with a friction fit.

The test button 124 on the circuit breaker 100 may be actuated using the adapter 200 (Block 702). For example, the "movable" actuator 226 (FIGS. 4A and 6A) may be employed as described above. Alternatively, the "fixed" actuator or protrusion 226' (FIGS. 4B and 6B) may be employed as described above.

The handle 122 of the circuit breaker 100 may be moved from the off position to the on position (Block 704). This may be performed while the test button 124 is being actuated.

Output of a light signal from the circuit breaker 100 may be initiated in response to actuating the test button 124 and moving the handle 122 to the on position (Block 706). For example, the light signal output may be initiated after the handle 122 has been moved to the on position and the test button 124 has been actuated for a predetermined amount of time (e.g., two seconds). The light signal may then be received at the adapter 200 (Block 708).

Further operations that may be carried out using the system 10 will be apparent from the present description and figures.

FIG. 10 illustrates the enclosure 102 holding a plurality of the circuit breakers 100. The adapter 200 is shown in the installed position on one of the circuit breakers 100. It can be seen that, when the adapter 200 is installed on one of the circuit breakers 100, the adapter 200 may not physically interfere with any of the other circuit breakers 100. That is, the adapter 200 may not interfere with the functionality of any of the other circuit breakers 100 such as operation of the handles or test buttons. Further, the adapter 200 may be installed on the circuit breaker 100 without removing the panel or dead front 104.

In addition, with reference to FIG. 4, the side rails 210, 212, the upper rail 220, and/or the lower rail 221 of the adapter 200 may be configured to block and/or help reject ambient light. The may reduce the chance of data errors during data transfer from the circuit breaker 100 to the adapter 200. Referring to FIGS. 2, 4A, and 4B, and described above, the side rails 210, 212 may engage side surfaces 118, 120 of the circuit breaker front face 114 and the lower rail 221 may engage the lower surface 121 of the circuit breaker front face 114 when the adapter 200 is in the installed position. In addition, the upper rail 220 may engage the circuit breaker front face 114 when the adapter 200 is in the installed position to thereby effectively block ambient light during data transfer. In this regard, it is contemplated that the light source of the circuit breaker and the light sensor of the adapter do not need to be precisely aligned in some embodiments. That is, the light source and the light sensor may be optically coupled with the adapter in the installed position on the circuit breaker.

Figure 11:
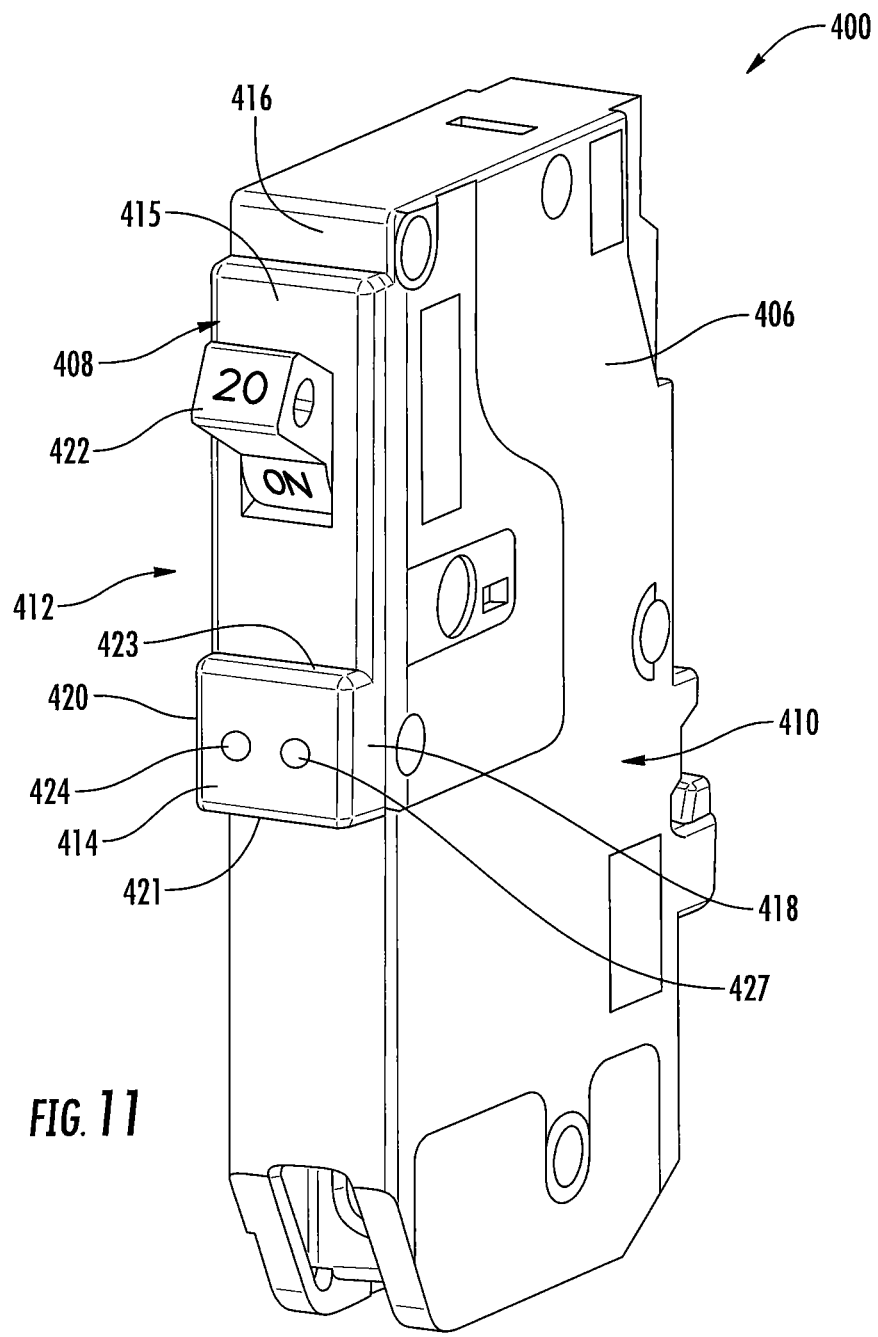
FIG. 11 is a front perspective view of a circuit breaker of the system of FIG. 1 according to some other embodiments.
Figure 12A:
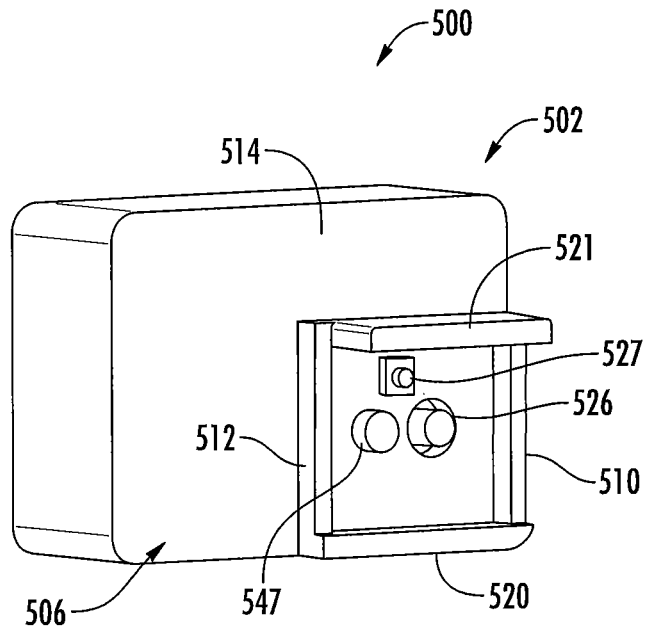
FIGS. 12A and 12B are rear perspective views of an adapter of the system of FIG. 1 according to some other embodiments.
Figure 12B:
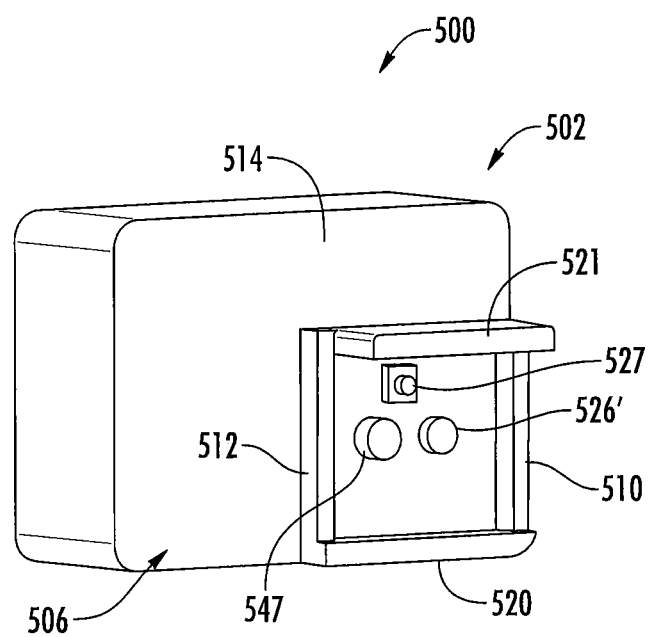

FIG. 11 illustrates another example circuit breaker 400. FIGS. 12A and 12B illustrate embodiments of an adapter 500 that can be used with the circuit breaker 400 in a similar way as described above in reference to the circuit breaker 100 and the adapter 200. The circuit breaker 400 and the adapter 500 may be used in the system 10 (FIG. 1) in place of the circuit breaker 100 and the adapter 200. The primary differences between the circuit breaker 400 and the circuit breaker 100 and the adapter 500 and the adapter 200 relate to how the adapter 500 releasably attaches to the circuit breaker 400, as described below.

Referring to FIG. 11, the circuit breaker 400 includes an enclosure or housing 406. The housing 406 includes a front or front portion 408 and first and second laterally spaced apart opposite sides or side portions 410, 412. A primary front or exposed face 414 may be on the front portion 408. The primary front face 414 may be raised relative to a flat surface 416 of the front portion 408. The primary raised front face 414 may include a perimeter with first and second laterally spaced apart opposite side surfaces or walls 418, 420. The primary raised front face 414 may also include a lower or bottom surface or wall 421 and/or an upper or top surface or wall 423. A secondary front or exposed face 415 may be on the front portion 408. The secondary front face 415 may be raised relative to the flat surface 416 of the front portion 408, but may be raised to a lesser degree than the primary raised front face 414 (e.g., the primary front face 414 may extend a greater distance away from the flat surface 416 than does the secondary front face 415).

The circuit breaker 400 includes a handle or switch 422 at the front portion 408 of the housing 406. The handle 422 may extend through the flat surface 416 of the front portion 408 or may extend through the secondary front face 415. The handle 422 is movable (e.g., pivotable) between an on position and an off position, with the handle 422 shown in the on position in FIG. 11. The handle 422 may function in the same way or substantially the same way as the handle 122 of the circuit breaker 100.

The circuit breaker 400 may include a user interface input such as a test button 424 at the front portion 408 of the housing 406. The button 424 may extend through or be flush with the front face 414 (e.g., when not depressed). The button 424 may function in the same way or substantially the same way as the button 124 of the circuit breaker 100. There may be a light source 427 such as an LED on the front face 414 or elsewhere on the circuit breaker 400. For example, the light source 427 may be adjacent the button 424. The light source 427 may function in the same way or substantially the same way as the light source 127 of the circuit breaker 100.

Referring to FIGS. 12A and 12B, the adapter 500 includes an enclosure or housing 502. The housing 502 includes a front portion 504 (FIG. 13) and a rear portion 506. The adapter 500 includes first and second spaced apart side rails 510, 512 at the rear portion 506. The rails 510, 512 may extend outwardly from a rear face or surface 514 of the adapter housing 202.

The adapter 500 may include an upper rail 520. The upper rail 520 may be perpendicular to the first and second side rails 510, 512. The adapter 500 may include a lower rail 521. The lower rail 521 may be perpendicular to the first and second side rails 510, 512. The lower rail 521 may extend outwardly from the rear surface 514 a greater amount or distance than the upper rail 520. The lower rail 521 may extend outwardly from the rear surface 514 the same or about the same amount or distance as the first and second side rails 510, 512.

Referring to FIG. 12A, the adapter 500 may include an actuator 526 that functions the same way or substantially the same way as the actuator 226 of the adapter 200. Alternatively, referring to FIG. 12B, the adapter 200 may include a fixed protrusion 526' such as a pin or post that engages the test button 124 of the circuit breaker 100 when the adapter 200 is in the installed position (FIG. 13).

The adapter 500 may include a power or wake up button 527 that protrudes from the rear surface 514 of the adapter 500. The power button 527 may function in the same way or substantially the same way as the power button 227 of the adapter 200.

The adapter 500 may include a light sensor 547 at the rear portion 506 thereof. The light sensor 547 may function in the same way or substantially the same way as the light sensor 247 of the adapter 200.

Figure 13:
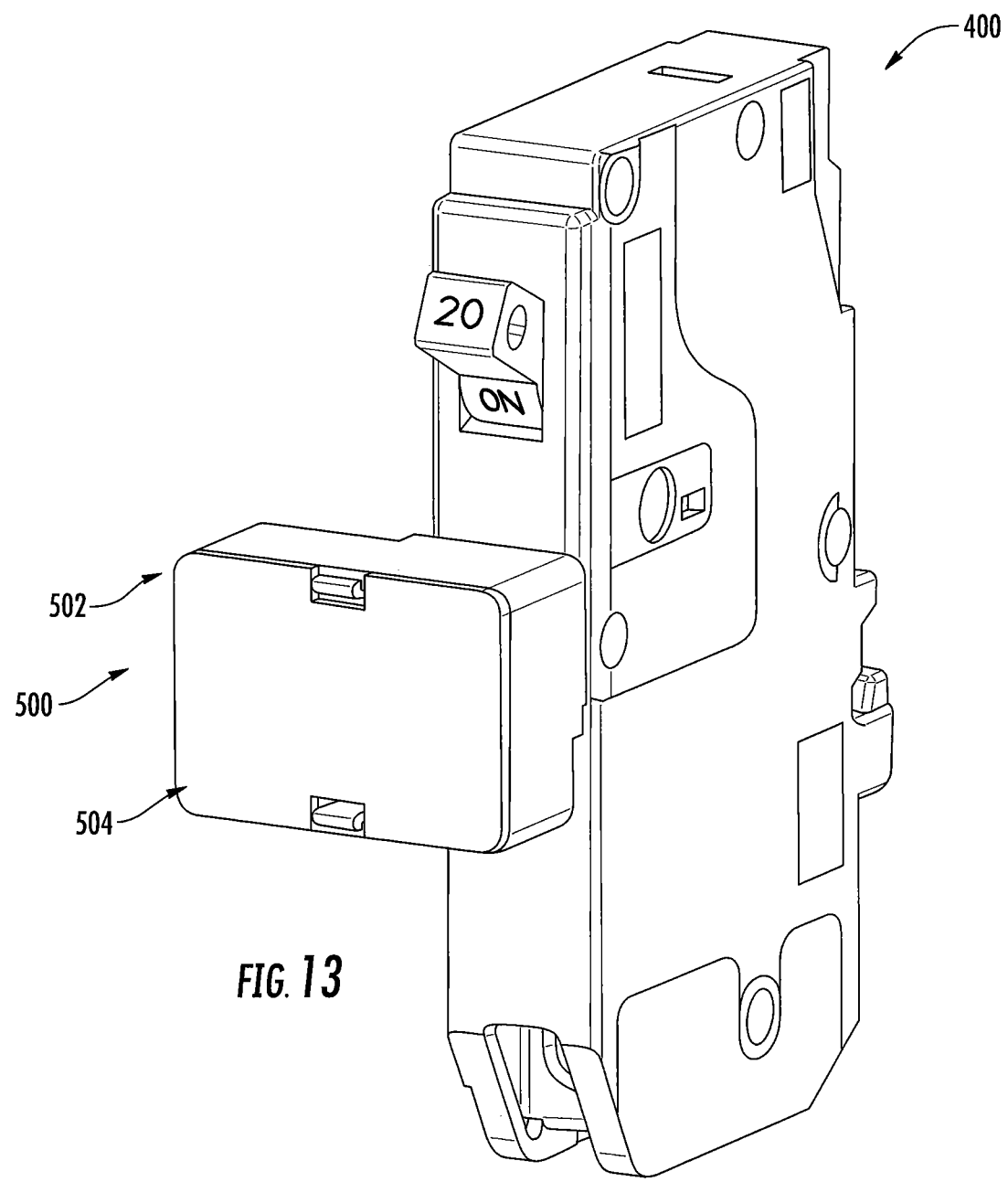
FIG. 13 is a perspective view of the adapter of FIG. 12B installed on the circuit breaker of FIG. 11 in an installed position.

In use, a user installs the adapter 500 on the circuit breaker 400 in the installed position as shown in FIG. 13. With reference to FIGS. 11, 12A, and 12B, the first and second rails 510, 512 may engage the first and second side surfaces 418, 420, respectively, of the circuit breaker front face 114. The first and second rails 510, 512 may be spaced apart the same distance or a lesser distance than the first and second side surfaces 418, 420 so that the adapter 500 is held on the circuit breaker 400 with a friction or interference fit in the installed position.

The first and second rails 510, 512 may help align the adapter 500 in a first direction (e.g., horizontally). The lower rail 521 may help align the adapter 500 in a second direction that is perpendicular to the first direction (e.g., vertically). In the installed position, the lower rail 521 may engage the lower surface 421 of the circuit breaker front face 414. In the installed position, the upper rail 520 may engage the upper surface 423 of the circuit breaker front face 414. The cooperation of the lower rail 521 and the lower surface 421 of the circuit breaker front face 414 and/or the cooperation of the upper rail 520 and the upper surface 423 of the circuit breaker front face 414 may contribute to the friction fit with the adapter 500 in the installed position.

The adapter lower rail 521 may extend from the adapter rear surface 514 a greater distance than the adapter upper rail 520. This may be due to the circuit breaker lower surface 421 extending a greater distance from the flat surface 416 than does the circuit breaker upper surface 423.

In the installed position, the adapter 500 may receive operational data from the circuit breaker 400 in the same or similar manner as described above in reference to the circuit breaker 100 and the adapter 200. The rails 510, 512, 520, 521 may be configured to block and/or help reject ambient light. The may reduce the chance of data errors during data transfer from the circuit breaker 400 to the adapter 500.

A user can fit the adapter described herein on a circuit breaker and perform a unique action to initiate transfer of data the breaker has collected during its time in use. The data that is transferred to the adapter can then be transferred to a cellular phone or smartphone, laptop, or other suitable electronic device for analysis. This solution is unique as it does not require the load center's dead front to be removed or the circuit breaker to be disassembled in any way while still receiving operational data for diagnostics.

With the introduction of this solution, a technician can visit a problem site without an electrician, as the technician will not be exposed to any dangerous voltage levels because the dead front does not need to be removed and the breakers remain in place. The technician can use the adapter to gather data from as many breakers as the technician deems appropriate to diagnose the problem, and potentially diagnose the problem with significantly greater speed and accuracy. This solution also eliminates the need to scrap a potentially functional breaker. It is believed this solution can increase the speed at which problems can be resolved and provide an additional level of service that previously did not exist to the same capacity.

The foregoing is illustrative of the present invention and is not to be construed as limiting thereof. Although a few example embodiments of this invention have been described, those skilled in the art will readily appreciate that many modifications are possible in the example embodiments without materially departing from the teachings and advantages of this invention. Accordingly, all such modifications are intended to be included within the scope of this invention as defined in the claims. The invention is defined by the following claims, with equivalents of the claims to be included therein.

What is claimed is:

1. A method for obtaining operational data from a circuit breaker, the method comprising:
   releasably attaching an adapter to a circuit breaker;
   actuating a test button on the circuit breaker using the adapter;
   moving a handle of the circuit breaker to an on position;
   initiating output of a light signal from the circuit breaker that is representative of operational data of the circuit breaker in response to the actuating and moving steps; and
   receiving the light signal at the adapter.

2. The method of claim 1 further comprising confirming that the test button was actuated for a predetermined period of time after the moving step, wherein the initiating output step is further in response to the confirming step.

3. The method of claim 1 wherein:
   the adapter comprises an actuator comprising a first portion that is configured to extend from a front surface of the adapter and a second portion that is configured to extend from a rear surface of the adapter; and
   actuating the test button on the circuit breaker comprises engaging the test button with the second portion of the actuator in response to pressing the first portion of the actuator toward the front surface of the adapter.

4. The method of claim 1 wherein actuating the test button on the circuit breaker is in response to the releasably attaching step.

5. The method of claim 1 further comprising powering on the adapter in response to the releasably attaching step.

6. The method of claim 5 wherein:
   the adapter comprises a power button on a rear portion of the adapter; and
   powering on the adapter in response to the releasably attaching step comprises engaging the power button with the circuit breaker.

7. The method of claim 1 wherein:
   the circuit breaker comprises a light source and the adapter comprises a light sensor; and
   the method comprises aligning the light source and the light sensor in response to the releasably attaching step.

8. The method of claim 1 wherein the adapter comprises at least one indicator that is viewable by a user, and wherein the method further comprises:
   determining whether a completion of the light signal was received at the adapter;

using the at least one indicator, indicating in a first way in response to determining that the completion of the light signal was received at the adapter; and using the at least one indicator, indicating in a second, different way in response to determining that the completion of the light signal was not received at the adapter.

9. The method of claim 1 further comprising:

processing the light signal into data using the adapter;

wirelessly transmitting the data from the adapter to an electronic device; and displaying the data at the electronic device, wherein the data corresponds to the operational data of the circuit breaker.

10. The method of claim 9 further comprising wirelessly receiving a data request from the electronic device at the adapter, wherein the wirelessly transmitting step is in response to the wirelessly receiving step.

11. A system for obtaining operational data of a circuit breaker, the system comprising:

a circuit breaker comprising a front face, a test button on the front face, and a handle movable between an on position and an off position;

an adapter configured to be releasably attached to the front face of the circuit breaker in an installed position, wherein, in the installed position, the adapter is configured to:

actuate the test button; and receive a light signal from the circuit breaker that is representative of operational data of the circuit breaker.

12. The system of claim 11 wherein the adapter is configured to receive the light signal in response to the handle being moved to the on position with the test button being actuated for at least a predetermined period of time.

13. The system of claim 11 wherein:

the circuit breaker comprises a light source on the front face that is configured to output the light signal;

the adapter comprises a light sensor that is configured to receive the light signal; and the light source is aligned with the light sensor with the adapter in the installed position.

14. The system of claim 11 wherein:

the adapter comprises an actuator comprising a first portion that is configured to extend through and away from a front surface of the adapter and a second portion that is configured to extend through and away from a rear surface of the adapter; and the second portion of the actuator actuates the test button in response to pressing the first portion of the actuator toward the front surface of the adapter.

15. The system of claim 11 wherein the adapter actuates the test button in response to the adapter being releasably attached to the front face of the circuit breaker in the installed position.

16. The system of claim 11 wherein:

the adapter comprises a power button on a rear surface of the adapter;

the front face of the circuit breaker engages the power button with the adapter in the installed position to energize the adapter such that the adapter is configured to receive the light signal and process data associated with the light signal.

17. The system of claim 11 wherein:

the adapter comprises at least one indicator that is configured to confirm that a completion of the light signal was received at the adapter.

18. The system of claim 11 wherein:

the system further comprises an electronic device comprising a display;

the adapter is configured to process data associated with the light signal and wirelessly transmit the processed data to the electronic device; and the electronic device is configured to display the processed data on the display, wherein the processed data corresponds to the operational data of the circuit breaker.

19. The system of claim 18 wherein:

the electronic device is configured to send a data request to the adapter; and the adapter is configured to wirelessly transmit the processed data in response to receiving the data request.

20. The system of claim 11 wherein the adapter is held on the circuit breaker with a friction fit in the installed position.

* * * * *